(12) United States Patent
Ryu

(10) Patent No.: US 7,785,909 B2
(45) Date of Patent: Aug. 31, 2010

(54) IMAGE SENSOR AND METHOD FOR MANUFACTURING THE SAME

(75) Inventor: Sang Wook Ryu, Cheongjoo-si (KR)

(73) Assignee: Dongbu Hitek Co., Ltd., Seoul (KR)

(*) Notice: Subject to any disclaimer, the term of this patent is extended or adjusted under 35 U.S.C. 154(b) by 397 days.

(21) Appl. No.: 11/842,706

(22) Filed: Aug. 21, 2007

(65) Prior Publication Data
US 2008/0150051 A1 Jun. 26, 2008

(30) Foreign Application Priority Data
Dec. 20, 2006 (KR) .................. 10-2006-0131353

(51) Int. Cl.
*H01L 21/00* (2006.01)
(52) U.S. Cl. .............. 438/29; 438/7; 438/27; 438/65; 438/69; 257/432; 349/95
(58) Field of Classification Search ............ 349/95; 257/432; 438/7, 27, 29, 65, 69
See application file for complete search history.

(56) References Cited

U.S. PATENT DOCUMENTS 5,198,305 A * 3/1993 Wada et al. .................. 428/463
6,008,511 A * 12/1999 Tokumitsu et al. .......... 257/232
6,690,049 B2 * 2/2004 Suzuki et al. ............... 257/294
2005/0280111 A1 * 12/2005 Lim ........................... 257/462
2006/0227214 A1 * 10/2006 Fleury et al. ................ 348/148

FOREIGN PATENT DOCUMENTS

| CN | 1815747 A | 8/2006 |
|---|---|---|
| KR | 10-2004-0029069 | 11/2005 |
| KR | 10-2004-0046536 | 12/2005 |

* cited by examiner

*Primary Examiner*—Charles D Garber
*Assistant Examiner*—Yasser A Abdelaziez
(74) *Attorney, Agent, or Firm*—Saliwanchik, Lloyd & Saliwanchik

(57) ABSTRACT

An image sensor and method of manufacturing thereof are provided. In an embodiment, an image sensor can include a photodiode on a substrate, an interlayer dielectric formed on the substrate, an insulating layer micro-lens on the interlayer dielectric, and an organic micro-lens on the insulating layer micro-lens.

9 Claims, 5 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2006-0131353, filed Dec. 20, 2006, which is hereby incorporated by reference in its entirety.

BACKGROUND

In an image sensor, to improve photo sensitivity, either a fill factor, which is a ratio of a photodiode area to the whole area of the image sensor, is increased, or a photo-gathering technology is used to change the path of light incident onto an area other than the photodiode area such that the light can be collected in the photodiode.

When a manufacturing process of an image sensor has been completed, the image sensor is subject to a packaging process, and an external lens is attached to the image sensor.

However, according to the related art as illustrated in FIG. 1, although the image sensor does not have a problem in forming images at the center of the image sensor chip using light incident from an external lens 3, the amount of light introduced into a photodiode 2 by passing through a micro-lens 1 is gradually decreased from the center of the image sensor chip to an edge (A) of the image sensor chip.

Accordingly, as the amount of light incident onto a unit pixel is changed, the number of generated electrons changes, so that a color image formed at the center of the image sensor is different from a color image formed at the edge of the image sensor even if the color of an original image is not changed.

Such a phenomenon, together with crosstalk to adjacent pixels, lowers reliability of the image sensor, so that light efficiency is lowered.

BRIEF SUMMARY

Embodiments of the present invention can provide an image sensor and a method of manufacturing the same, capable of reducing a focal difference of light between the center portion and the edge portion of the image sensor chip.

An image sensor according to an embodiment comprises a photodiode on a substrate, an interlayer dielectric on the substrate, a first type layer micro-lens on the interlayer dielectric and a second type layer micro-lens on the first type layer micro-lens. The first type layer can be a material having a refraction index of 1.4 or above in 633 nm wavelength. The second type layer can be an organic material.

In addition, a method of manufacturing an image sensor according to an embodiment comprises forming a photodiode on a substrate, forming an interlayer dielectric on the substrate, forming a first material layer on the interlayer dielectric, forming a first material layer micro-lens by etching the first material layer and forming a second material layer micro-lens on the first material layer micro-lens.

DETAILED DESCRIPTION

Hereinafter, an image sensor and a method of manufacturing the same according to embodiments of the present invention will be described with reference to the accompanying drawings In the disclosure, the expression 'formed on/under layer' includes the cases directly formed on/under layer or indirectly formed by interposing other layer(s) therebetween.

Figure 1:
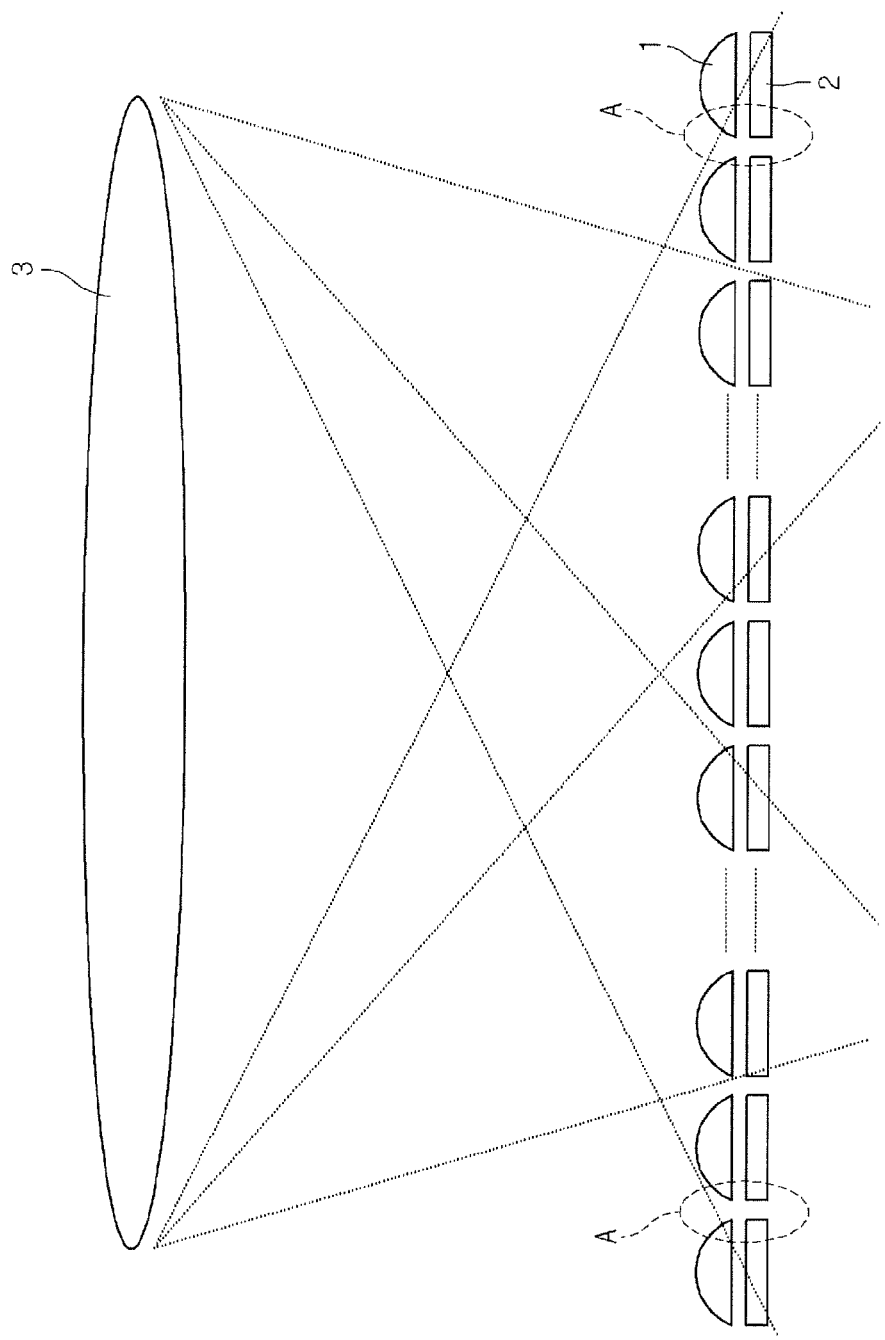
FIG. 1 is a schematic view representing a path of light incident onto an image sensor chip from an external lens.
Figure 2:
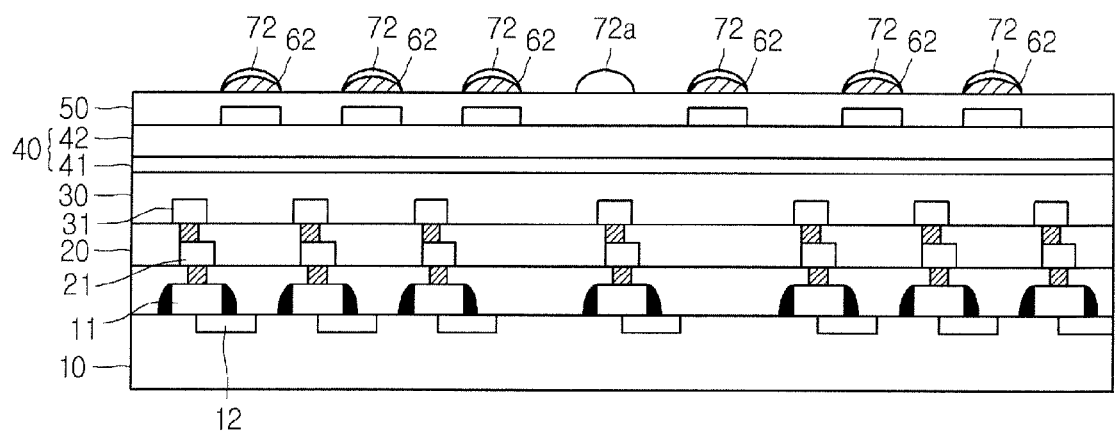
FIG. 2 is a cross-sectional view of an image sensor according to an embodiment.

FIG. 2 is a cross-sectional view of an image sensor according to an embodiment.

An image sensor according to an embodiment can include a photodiode 12 formed on a substrate 10 and at least one interlayer dielectric layer formed on the substrate 10 (for example, 20 and 30 of FIG. 2). A first type micro-lens 62 can be formed on the substrate and a second type micro-lens 72 can be formed on the first type micro-lens 62. The first type micro-lens 62 can be formed of a highly reflective material, and the second type micro-lens 72 can be formed of a conventional microlens material. For example, the first type micro-lens 62 can be an insulating layer micro-lens formed on the substrate, and the second type micro-lens 72 can be a first organic micro-lens formed on the insulating layer micro-lens 62.

In the image sensor according to an embodiment, the insulating layer micro-lens having a high refractive index can be formed at an edge portion of the pixel so as to prevent light mismatch between the edge portion and the center portion of the pixel, thereby improving light efficiency and preventing crosstalk an adjacent pixel.

For example, an insulating layer micro-lens 62 can be formed at the edge portion of the image sensor chip. The edge portion is a portion of the upper surface of an image sensor around a center portion. For example, the center portion of the image sensor can correspond to 4% of an entire upper surface of the image sensor, and the remaining area of the image sensor can be defined as the edge portion, but embodiments are not limited thereto.

In addition, according to the embodiment, the insulating layer micro-lens 62 includes an insulating layer having a high refractive index. In one embodiment, the insulating layer micro-lens 62 can be formed using an insulating layer having a refractive index (RI) of 1.4 or above in 633 nm of wavelength. However, other materials having a high refractive index and that are transparent can be used.

The insulating layer micro-lens 62 can include an oxide layer micro-lens.

In an embodiment, the insulating layer micro-lens 62 and the first organic micro-lens 72 can have hydrophobic characteristics, so that they can be easily bonded to each other while forming the lens configuration.

In a further embodiment, a second organic micro-lens 72a can be formed at the center portion of the image sensor chip.

Other reference numerals not described above will be explained with reference to a method of manufacturing an image sensor as described below.

Hereinafter, a method of manufacturing the image sensor according to an embodiment will be described with reference to FIGS. 3 to 8.

Figure 3:
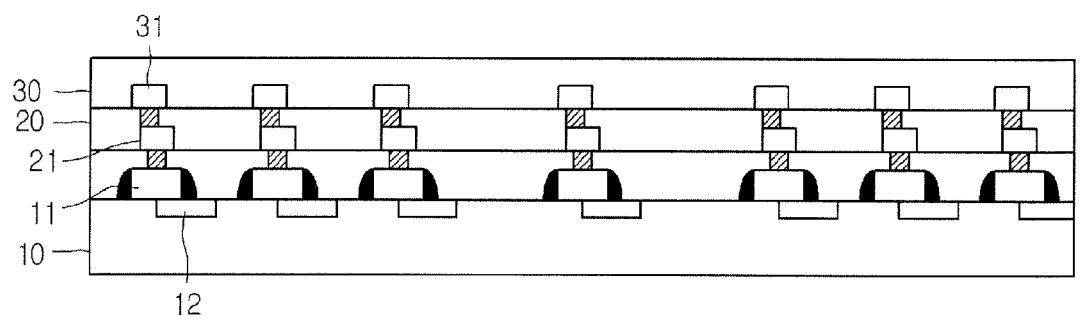
FIGS. 3 to 8 are cross-sectional views for illustrating a method of manufacturing an image sensor according to an embodiment.

Referring to FIG. 3, a photodiode 12 can be formed on the substrate 10.

In addition, according to an embodiment, a gate electrode 11, interconnections, and interlayer dielectric layers can be formed.

For example, referring to FIG. 3, a first interlayer dielectric 20 and a first interconnection 21 can beformed. After that, a second interlayer dielectric 30 and a second interconnection 31 can be formed on the first interlayer dielectric 20.

Figure 4:
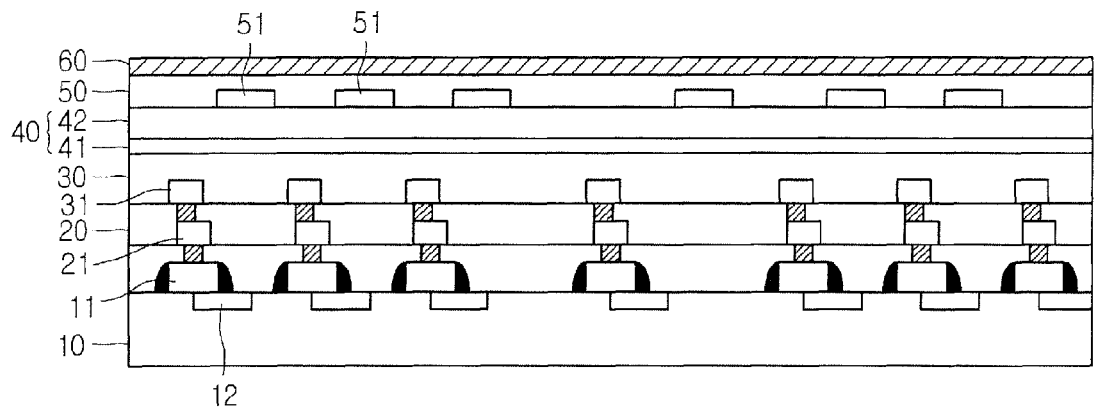

Then, referring to FIG. 4, a passivation layer 40 can be formed on the second interlayer dielectric 30. The passivation layer 40 can include a PE-TEOS layer 41 and a PE-Nitride layer 42. The PE-TEOS layer 41 can be deposited on the second interlayer dielectric 30, and then a PE-Nitride layer 42 can be deposited on the PE-TEOS 41, thereby forming the passivation layer 40.

After that, a color filter 51 can be formed on the passivation layer 40 and a planarization layer 50 including organic material can be formed on the passivation layer 40. The planarization layer 50 can have a thickness of 1000 Å to 10,000 Å. Then, an insulating layer 60 can be formed on the planarization layer 50. The insulating layer 60 can include a nitride layer or an oxygen layer, but the insulating layer 60 is not limited thereto.

In an embodiment, the insulating layer 60 can be a low temperature nitride layer 60 having a thickness of 1000 Å to 10,000 Å formed on the planarization layer 50 at a temperature of 200° C. or below. The insulating layer 60 can be used to form an insulating layer micro-lens.

In an image sensor according to an embodiment, an insulating layer micro-lens having a high refractive index can be formed at the edge portion of the pixel so as to prevent light mismatch between the edge portion and the center portion of the pixel, thereby improving light efficiency. For instance, the insulating layer micro-lens can include an insulating layer 60 having a refractive index (RI) of 1.4 or above in 633 nm of wavelength.

Figure 5:
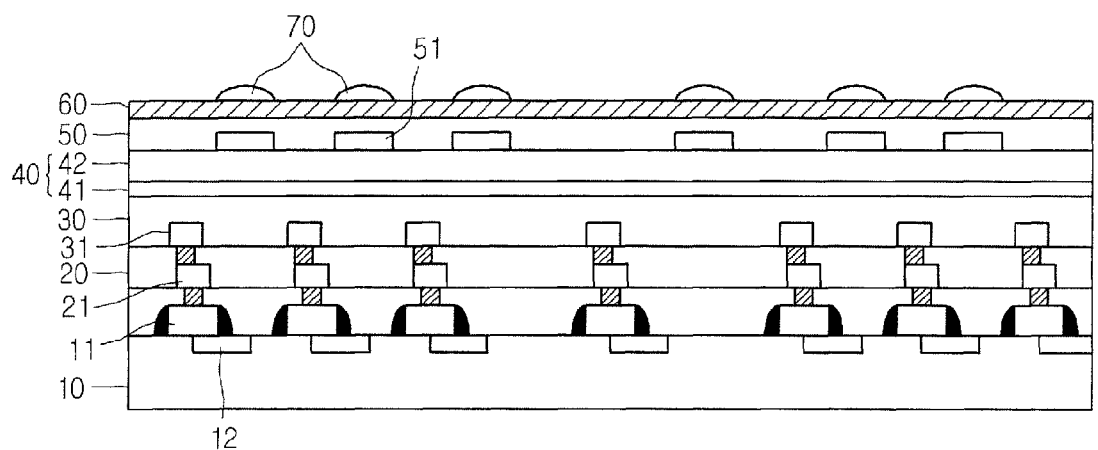

Referring to FIG. 5, a first photoresist pattern (not shown) can be formed on the insulating layer 60. Then, a second photoresist pattern 70 in the form of a lens shape can be formed by reflowing the first photoresist pattern.

Figure 6:
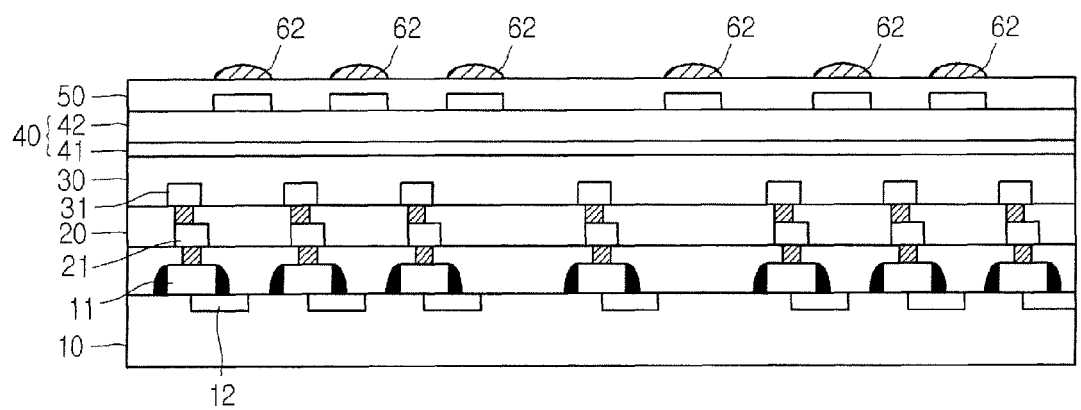

Then, as shown in FIG. 6, the insulating layer 60 can be etched by using the second photoresist pattern 70 as a mask to form an insulating layer micro-lens 62.

In an embodiment, the insulating layer micro-lens 62 can be formed by a dry-etching of the insulating layer 60. At this time, the insulating layer 60 can be etched using at least one gas selected from an etching gas based on $C_XH_YF_Z$ (X, Y, and Z are 0 and natural numbers). The etching can optionally include an inert gas such as Argon (Ar), Helium (He), Oxygen ($O_2$) and Nitrogen ($N_2$) with the etching gas.

The insulating layer micro-lens 62 can be formed at the edge portion of the image sensor chip. For example, in a case where the center portion of the image sensor corresponds to 4% of an entire upper surface area of the image sensor, the insulating layer micro-lens 62 can be formed at the remaining area of the image sensor, that is, the edge portion.

Accordingly, an insulating layer micro-lens 62 can be formed at the edge portion of the image sensor chip. Although the insulating layer micro-lens 62 is described as being formed at the edge portion of the image sensor chip, embodiments are not limited thereto. That is, the insulating layer micro-lens 62 can be formed on the entire surface of the image sensor chip.

Figure 7:
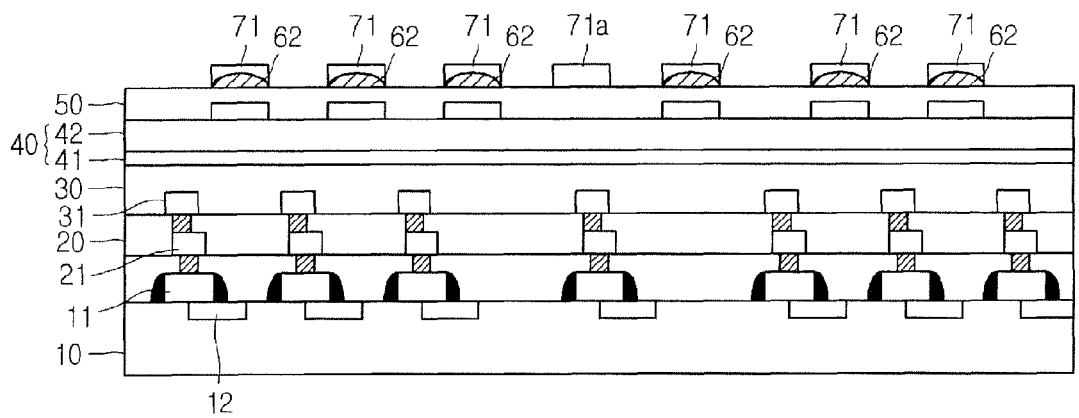

Referring to FIG. 7, a third photoresist layer 71 can be formed on the insulating layer micro-lens 62.

According to an embodiment, a fourth photoresist pattern 71a can be further formed on the center portion of the image sensor chip while the third photoresist pattern 71 is being formed on the insulating layer micro-lens 62.

Figure 8:
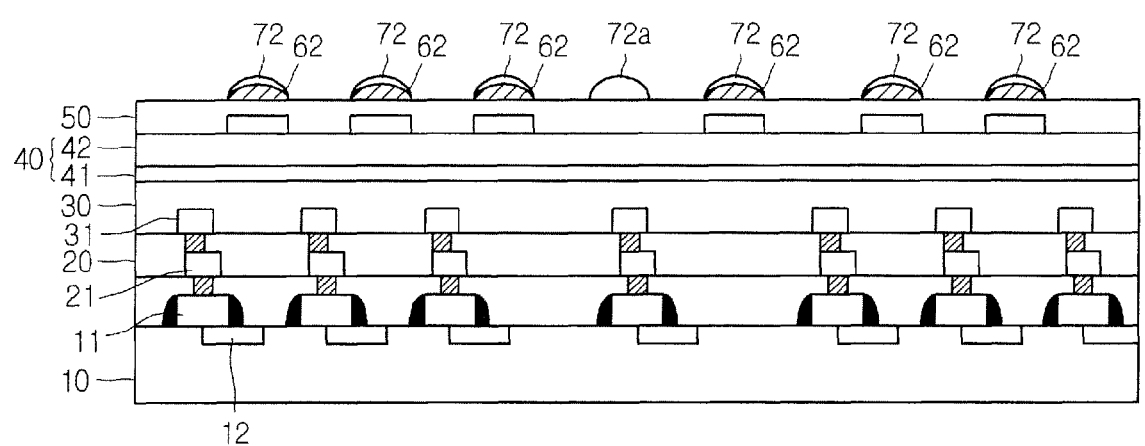

After that, as shown in FIG. 8, a first organic micro-lens 72 can be formed on the insulating layer micro-lens 62 by reflowing the third photoresist pattern 71.

In addition, a second organic micro-lens 72a can be formed by reflowing the fourth photoresist pattern 71a formed at the center portion of the image sensor chip, which is performed simultaneously with the step of forming the first organic micro-lens 72 on the insulating layer micro-lens 62.

In this case, according to an embodiment, the insulating layer micro-lens 62 and the first organic micro-lens 72 can have hydrophobic characteristics, so they can be easily bonded to each other to form the lens configuration.

According to an embodiment, an insulating layer lens having a high refractive index (RI) can be formed at the edge portion of the pixel to prevent light mismatch between the edge portion and the center portion of the pixel, thereby improving light efficiency.

In addition, according to an embodiment, an insulating lens having a high refractive index (RI) can be formed at the edge portion of the pixel, thereby inhibiting cross talk to the adjacent pixel.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a first type layer on a substrate;
    forming a first type layer micro-lens by etching the first type layer, wherein the first type layer micro-lens is formed at an edge portion of the image sensor, wherein the edge portion of the image sensor corresponds to an upper surface area of the image sensor around a center portion;
    forming a second type layer micro-lens on the first type layer micro-lens; and
    forming a third micro-lens of the second type layer at the center portion of the image sensor when forming the second type layer micro-lens on the first type layer micro-lens.

2. The method according to claim 1, wherein forming the first type layer micro-lens by etching the first type layer comprises:
    forming a first photoresist pattern on the first type layer;

forming a second photoresist pattern in a shape of lens by reflowing the first photoresist pattern; and using the second photoresist pattern as a mask when etching the first type layer.

3. The method according to claim 1, wherein forming the first type layer micro-lens by etching the first type layer comprises etching the first type layer using at least one selected from the group consisting an etching gas based on $C_xH_yF_z$ where X,Y, and Z are 0 and natural numbers.

4. The method according to claim 3, wherein etching the first type layer further comprises using an inert gas selected from the group consisting of Argon (Ar), Helium (He), Oxygen ($O_2$), and Nitrogen ($N_2$).

5. The method according to claim 1, wherein the first type layer micro-lens comprises a material layer having a refractive index of 1.4 or above in a wavelength of 633 nm.

6. The method according to claim 1, wherein the first type layer micro-lens comprises a nitride layer micro-lens.

7. The method according to claim 1, wherein forming the second type layer micro-lens comprises:

forming a third photoresist pattern on the first type layer micro-lens; and reflowing the third photoresist pattern.

8. The method according to claim 1, wherein forming the second type layer micro-lens and forming the third micro-lens of the second type layer comprises:

simultaneously forming a third photoresist pattern on the first type layer micro-lens and a fourth photoresist pattern on the substrate at a center portion of the image sensor; and performing a reflow process with respect to the third photoresist pattern and the fourth photoresist pattern.

9. The method according to claim 1, wherein the center portion of the image sensor corresponds to 4% of an entire upper surface of the image sensor, and a remaining area except the center portion of the image sensor corresponds to the edge portion.

* * * * *